United States Patent [19]

Hoover et al.

[11] Patent Number: 5,818,637
[45] Date of Patent: Oct. 6, 1998

[54] COMPUTERIZED VIDEO MICROSCOPY SYSTEM

[76] Inventors: Rex A. Hoover; Robert G. Hoover, both of 5263 Stewart Rd., Sumerduck, Va. 22742

[21] Appl. No.: 803,724

[22] Filed: Feb. 21, 1997

Related U.S. Application Data

[60] Provisional application No. 60/012,259 Feb. 26, 1996.

[51] Int. Cl.⁶ ............................ G02B 21/00; G02B 21/36; G02B 7/02
[52] U.S. Cl. ............................ 359/381; 359/363; 359/368; 359/821
[58] Field of Search ................................ 359/363, 368, 359/381, 821, 382, 383, 392, 399, 503, 504, 505, 506; 348/79, 36, 80; 396/74, 326, 432

[56] References Cited

U.S. PATENT DOCUMENTS

| | | |
|---|---|---|
| 1,995,599 | 3/1935 | Bauersfeld . |
| 3,565,512 | 2/1971 | Peck ........................................ 359/656 |
| 3,721,759 | 3/1973 | Lang ....................................... 348/345 |
| 3,721,827 | 3/1973 | Reinheimer ........................... 250/201.3 |
| 4,627,009 | 12/1986 | Holmes et al. ......................... 364/559 |
| 4,653,878 | 3/1987 | Nakasato et al. ...................... 359/381 |
| 4,676,608 | 6/1987 | Faubion ................................... 359/383 |
| 4,725,720 | 2/1988 | Sawada et al. ....................... 250/201.3 |
| 4,769,698 | 9/1988 | Ledley et al. ............................. 348/79 |
| 4,930,882 | 6/1990 | Koch et al. .............................. 359/392 |
| 5,121,220 | 6/1992 | Nakamoto .............................. 359/419 |
| 5,260,825 | 11/1993 | Nagano et al. ......................... 359/368 |
| 5,276,550 | 1/1994 | Kojima .................................... 359/368 |
| 5,473,706 | 12/1995 | Bacus et al. ............................ 382/133 |

*Primary Examiner*—Thong Nguyen
*Assistant Examiner*—Mark A. Robinson
*Attorney, Agent, or Firm*—Papan Devnani, Esq.; Thomas A. Powers, Ph.D.; Chandrakant C. Shroff.

[57] ABSTRACT

A novel computer-controlled video microscopy system, features a rotatable objective lens turret. The lens turret is a rotatable cylindrical drum having an open end and closed end. A plurality of light-transmitting objective lenses are evenly spaced about the side wall of the cylindrical drum. The objective lenses are each directed perpendicularly to the axis of rotation of the cylindrical drum. A computer is used to select a desired objective lens and signal a motor to rotate the cylindrical drum about its axis of rotation, so as to move the selected objective lens into the path of an approaching light beam. When the light beam enters the drum through the objective lens, a prism or mirror inside the cylindrical drum bends the light beam at a right angle and directs it out of the drum through its open end. An image carried by the light beam is then focused onto the imaging plane of a video camera. The microscope also features a computer-controlled stage which moves a sample in any direction in the x–y plane and an illumination system using either transmitted light or incident light.

40 Claims, 14 Drawing Sheets

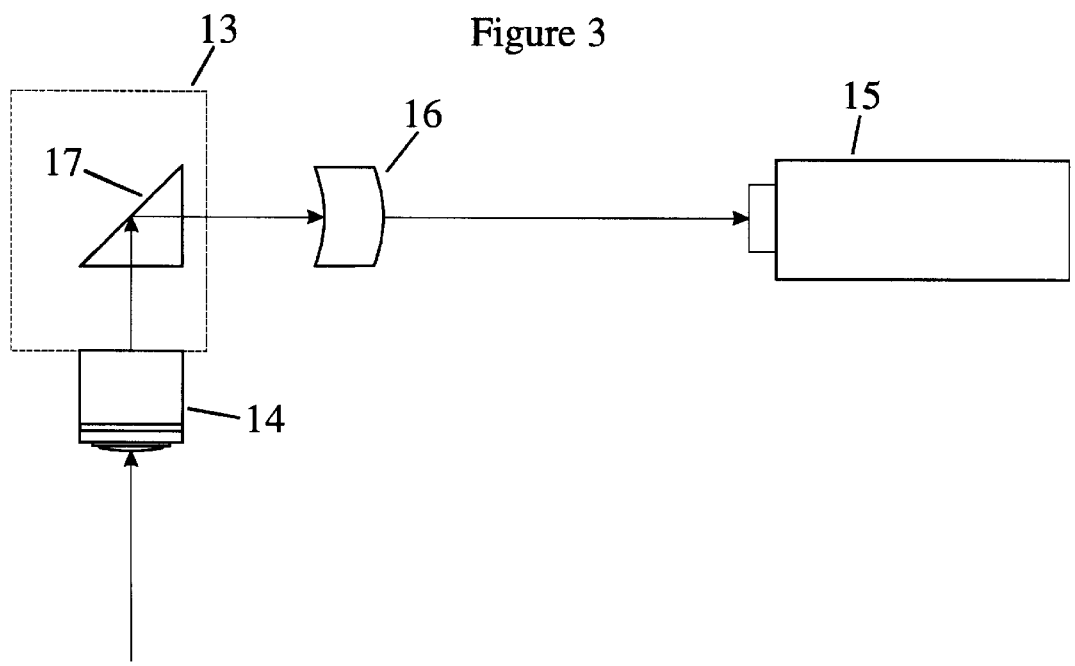

Figure 12a
Figure 12b
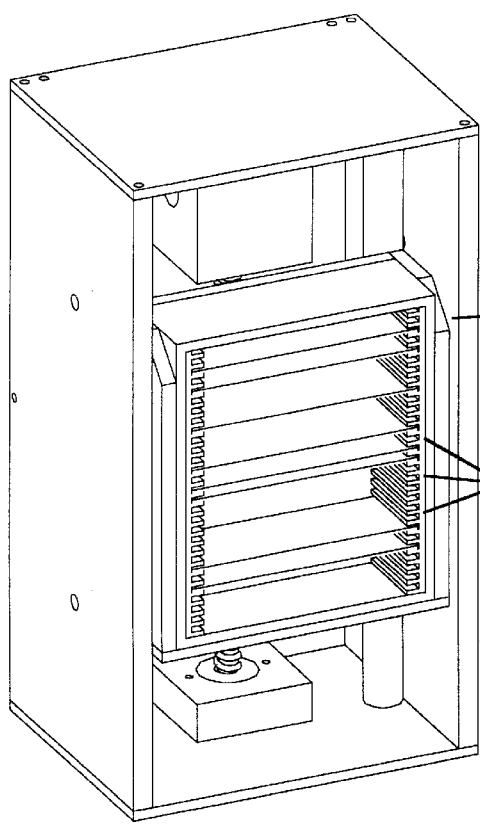
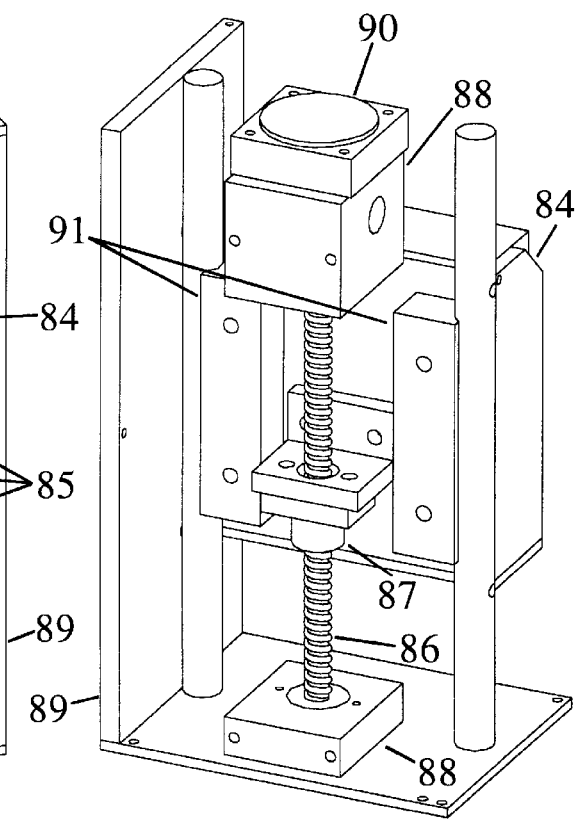

COMPUTERIZED VIDEO MICROSCOPY SYSTEM

This application claims benefit of U.S.C. provisional application No. 60/012,259 filed Feb. 26, 1996.

FIELD OF THE INVENTION

The invention relates to a computer-controlled, modular microscopy system that produces a magnified video image of a specimen of interest. All microscope components are contained within a sealed enclosure, with the positions of all moving parts of the microscope being controlled from a computer.

The invention also relates to an optical system for use with a video camera, where the optical system magnifies an image to be recorded by the camera.

BACKGROUND ART

Microscopes are conventionally-used optical instruments in a variety of fields where workers need clear images of structures too small to be seen by the naked eye. For example, medical professionals, biologists, and cytologists conventionally use microscopes to observe cell cultures or uni- or multicellular organisms, while electronics specialists conventionally use microscopes to study silicon wafers.

State-of-the-art microscopes consist of several assemblies that are attached to provide a functioning system. The major assemblies are the stand, a stage adapted to hold a sample, a lens turret having one or more objective lenses, an observation tube having one or two ocular lenses, and a means of illuminating a sample. The objective lens magnifies an image of the sample; the magnified image is then directed into the observation tube.

The foundation for a conventional microscopy system is the stand, which typically accounts for about 25% of the system price. The stand provides a stationary platform to hold the imaging and illumination optics. The stage is typically attached to the stand using a rack-and-pinion structure. This allows the stage to travel vertically toward the objective lens, or away from the objective lens, so as to focus the sample image seen through the observation tube.

The stage and observation tube may be arranged in either of two ways. In an upright microscope, the stage is positioned beneath the observation tube, with the objective lens being directed toward the sample. In an inverted microscope, the stage is positioned above the observation tube, with the objective lens being directed toward the sample. Whether the microscope is upright or inverted, the sample may be illuminated by transmitted light or by incident. In a transmitted light illumination system, a beam of light bearing an image of the sample is produced by shining a beam of light through the sample. In a incident light system, a beam of light bearing an image of the sample is produced by reflecting a beam of light off of the sample.

In addition to the above-described components, accessory assemblies such as still or video cameras, filters, or polarizers may be added to the microscope. Cameras are particularly useful accessories, as they allow a researcher to record an image for later study. However, most microscopes are designed to permit viewing of an image by the human eye, forcing the researcher to set up a special apparatus to support the camera above the ocular lens, and then carefully focus the image onto the imaging plane of the camera.

It is also known to control the distance between the microscope stage and the objective lens by computer, so as to provide automatic focus. For example, if the computer determines that the distance between the microscope stage and the objective lens is incorrect for the objective lens, the computer can send a signal to a motor which moves the stage toward or away from the objective lens. If the microscope has a rotary revolver having a plurality of objective lenses, a revolver position detecting device may determine which lens is in the optical path. If a lens having the wrong magnification is in the optical path, a signal is sent from the computer to a motor which rotates the revolver until the correct lens is in the optical path.

People that use optical microscopes have long been asking microscope designers to make microscopes more suitable for human use. The typical microscopist sits hunched over on a laboratory stool, peering downward through the ocular lens of his microscope, in a position guaranteed to cause severe back pain, neck pain, and/or eye strain. In fact, K.S. Lee and L.A. Humphreys, at the 29th Annual Meeting of the Proceedings of the Human Factors Society, reported that 84% of microscopists had job-related musculoskeletal pain. This forces many or most microscopists to leave the profession in considerably under ten years. In many cases, back or neck surgery is necessary to relieve job-related pain sufficiently to allow the microscopist to lead a normal life.

It has been suggested that this sorry statistic could be greatly reduced by using microscopes that display images on computer monitors. Additionally, conventional bench microscopes are designed so that handicapped people or people confined to wheelchairs have trouble reaching the eyepiece, making it difficult for them to pursue careers in microscopy. It is necessary to develop microscopes that can readily be used by the disabled. Microscopes that display images on computer monitors can be used in this way.

DESCRIPTION OF THE INVENTION

It is a first object of this invention to prepare a microscopy system having a video camera as an integral component, where the camera provides a detailed video image of a sample. The image of the sample is focused directly onto the imaging plane of the video camera. This makes the laborious steps of mounting a camera above an ocular lens and readjusting the focus of the microscope image onto the imaging plane unnecessary.

It is a second object of this invention to prepare microscopy systems that can be used without causing job-related musculoskeletal pain.

It is a third object of this invention to prepare microscopy systems that can be easily used by handicapped and/or injured microscopists.

It is a fourth object of this invention to provide a microscope which can be used for polarized light microscopy through the simple insertion of a polarizing filter into the microscopes illumination system, without requiring the use of an expensive, high-precision rotating stage.

The second and third objects are achieved by providing microscopes where magnified images are viewed on a video screen and where the positions of all moving parts (the stage, the objective lens, etc.) are remotely controlled from a computer.

This invention provides an improved computer-controlled video microscopy system. The key component of this system is an improved objective lens turret, comprising a cylindrical drum having a tubular side wall, a open end, a closed end, and an axis of rotation. A plurality of objective lenses, typically from three to twenty objective lenses, are evenly spaced about the tubular side wall of the cylindrical drum. All of the objective lenses are directed perpendicularly to the drum's axis of rotation. A light beam carrying an image of a sample to be observed enters the cylindrical drum perpendicularly to the axis of rotation of the drum through one of the objective lenses. A right angle prism, mirror, or other optical element then directs the light beam out of the cylindrical drum through the drum's open end. Typically, the light beam exits the cylindrical drum parallel to the drum's axis of rotation. Finally, the objective lens turret comprises a computer-controlled means of selecting one of the objective lenses and rotating the cylindrical drum about its axis of rotation until the selected objective lens enters the path of the light beam.

The microscopy system is also distinguished in that the eyepiece has been done away with and been replaced with a video camera. A lens system focuses the image carried by the light beam exiting the cylindrical drum onto the imaging plane of the video camera, which may be used to transmit the image to a video monitor. This video image can be closely observed for extended periods without causing eye strain or back pain. Handicapped workers can also view the video image without difficulty.

Other key components of the system include a stage, preferably a motorized stage which can automatically position a sample in the microscope's field-of-view. The system also includes illumination optics for producing the beam of light carrying the sample image. The individual components of the illumination optics can easily be removed and replaced with other components, including lenses, polarizers, and/or filters. This allows a great deal of flexibility in using the microscope.

The objective lens turret and the video camera are attached to a vertical plate via linear bearings or a rack-and-pinion system and move vertically under computer control to provide image focus.

DESCRIPTION OF THE DRAWINGS

FIG. 3 shows the path taken by a light beam from the objective lens to a video camera.

FIGS. 12a and 12b show a slide cartridge for use with this microscope.

DESCRIPTION OF THE PREFERRED EMBODIMENT

A) Introduction

The major parts of the computerized video microscopy system described herein include an imaging system, a motorized stage adapted to freely move a sample in a horizontal plane, an illumination system adapted to illuminate the sample and direct a beam of light carrying an image toward the imaging system, and a computer programmed to remotely control all key microscope functions. The imaging system focuses an image of the sample onto the imaging plane of a video camera. The image is focused by moving the imaging system vertically toward or away from the stage. The stand and the optical systems are supported on an improved stand especially designed for this system.

These components are individually described below in further detail.

B) The Microscope Support System

Figure 1:
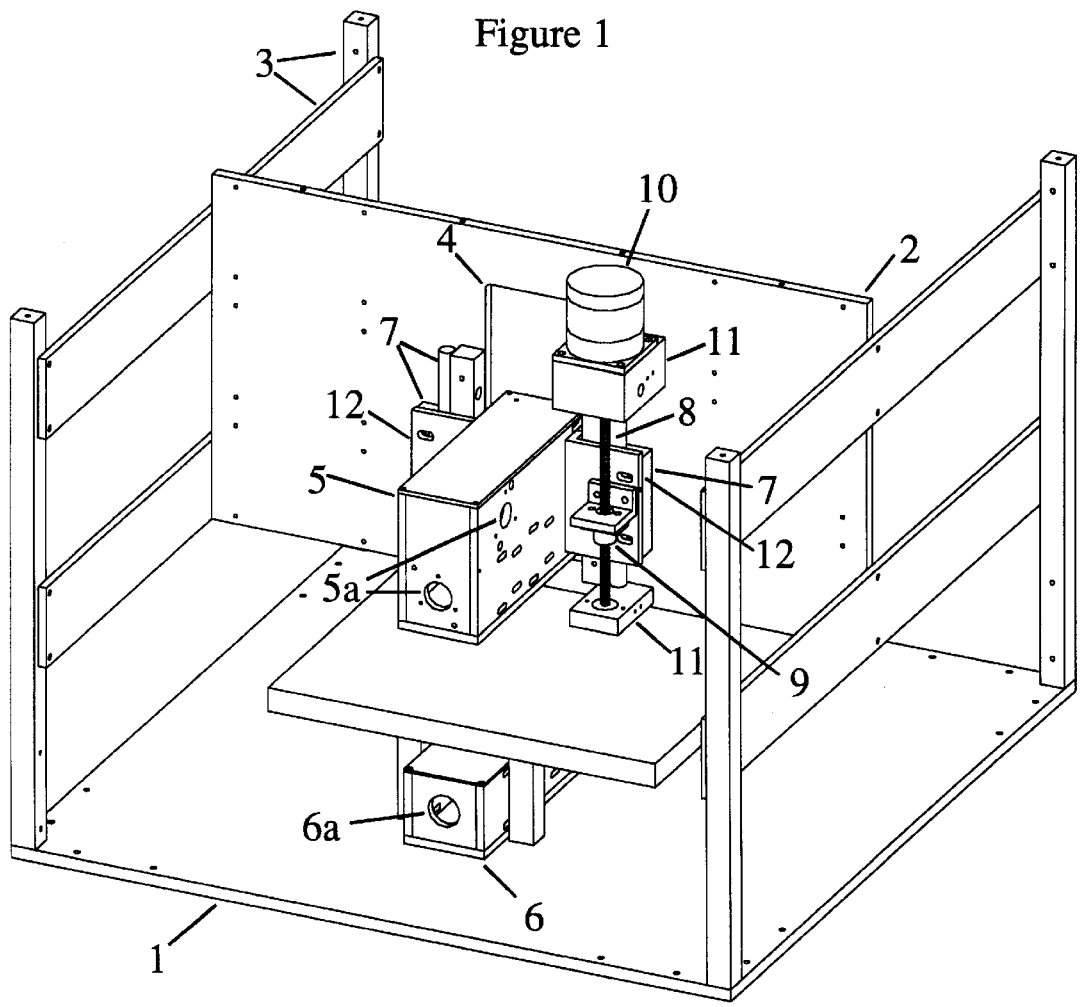
FIG. 1 shows the microscope support, including the optical channels and stage.

The microscope stand used in this invention, depicted in FIG. 1, is much simpler than currently-used microscope stands. The stand comprises a horizontal base plate 1, and a vertical plate 2 suspended above the base plate by support 3. For an upright microscope, the horizontal plate is the mounting surface for a horizontal stage. The vertical plate is rigidly suspended above the base plate. The vertical plate is penetrated by an elongated vertical hole 4 to allow a horizontal channel 5 containing the imaging optics and, if necessary, the incident light illuminating optics to be mounted to the vertical plate. Ports 5a allow for the transmission of light to or from channel 5. A second channel 6 containing the transmitted light illuminating optics may be present. Channel 6 is mounted to the horizontal plate and is positioned under the stage. Port 6a allows light to enter channel 6.

Channel 5 passes through the hole 4 in plate 2. Two plates 12 extending perpendicularly from the sides of channel 5 are mounted to plate 2 in such a way that plates 12 may travel vertically on plate 2 on linear bearings 7. When plates 12 travel vertically, they cause channel 5 to move vertically in hole 4. Preferably, high-precision crossed roller bearings or linear recirculating ball bearings are used as bearings 7. Recirculating ball bearings are most preferred due to their reduced cost.

Travel of channel 5 is achieved by means of a threaded vertical screw 8, preferably a screw having 20 threads/inch, rotatably mounted on plate 2 by brackets 11. A nut 9 driven by the threaded vertical screw is rigidly attached to channel 5 or to one of the plates 12. A stepper motor 10 is used to rotate the vertical screw. When the screw is rotated, the nut and the channel 4 or plate 12 attached thereto travel vertically on the screw. Preferably, a ball screw and a recirculating ball nut are used. The stepper motor is preferably an electronically-driven 0.45° stepper motor. This allows the channel to be positioned with a high degree of accuracy. Resolution of channel position is approximately 0.5 micrometers/step.

If a reduced degree of precision is acceptable in positioning the channel, a conventional screw and a threaded nut may be used. Alternatively, a rack-and-pinion system may be used to move channel 5. This system would comprise a vertical rack mounted on a plate 2 and a rotatable pinion engaging the rack, said pinion being attached to channel 6. A stepper motor may be used to rotate the pinion. This mechanism is less precise than the screw-and-nut system, and is therefore less preferred.

It is preferred that the stand be entirely enclosed. All microscope components are contained within the stand enclosure.

The above discussion is equally applicable to inverted microscopes, with the following exceptions. The vertical plate 2 rests directly on horizontal plate 1, with the stage being positioned above the vertical plate. If required, the channel holding the transmitted light optics is suspended above the stage via simple support brackets. If desired, channel 6 may be positioned above the top of the stand enclosure.

C) The Imaging System

Figure 2:
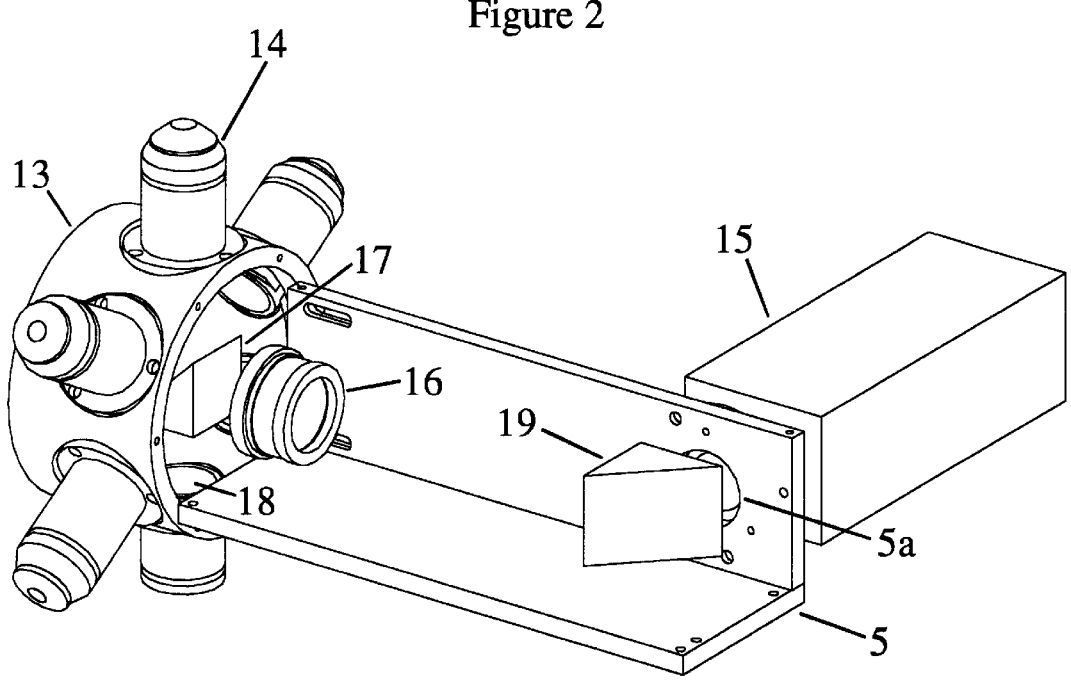
FIG. 2 provides a view of the microscope's imaging optics.

The imaging system of this microscope is illustrated in FIG. 2. The imaging system includes a rotary objective lens turret 13 having a plurality of objective lenses 14 and a lens system mounted inside channel 5 (The top and one side of channel 5 has been removed for clarity). Turret 13 has an open end, a closed end, and an axis of rotation. The lens system inside channel 5 is adapted to focus the light beam exiting the turret 13 through a port 5a and onto the imaging plane of a video camera 15, and typically comprises a tube lens 16. A right angle prism 17 is mounted inside turret 13. A hole 18 in the wall of turret 13 allows light to enter turret 13 through one of the objective lenses. Camera 15 is preferably positioned at right angles with channel 5, in which case a right angle prism 19 is mounted inside channel 5. If desired, right-angle prisms 17 or 19 may be replaced with mirrors. It is possible to omit prism 19 and position camera 15 so that it is mounted in line with channel 5.

As shown in FIG. 3, when the microscope is in use, a light beam carrying an image enters the turret 13 through one of lenses 14, and is then directed out of turret 13 through its open end by right-angle prism 17. Tube lens 16 then focuses the beam of light onto the imaging plane of camera 15, which is shown as being positioned so that it is directly in the path of the beam of light leaving turret 13. Prism 19 has been omitted from this figure. If prism 19 is present, it bends the beam of light at a right angle after it leaves the tube lens and directs it toward camera 15, which is positioned at a right angle with the beam of light leaving turret 13. The elements of this system will now be described in further detail.

Figure 4A:
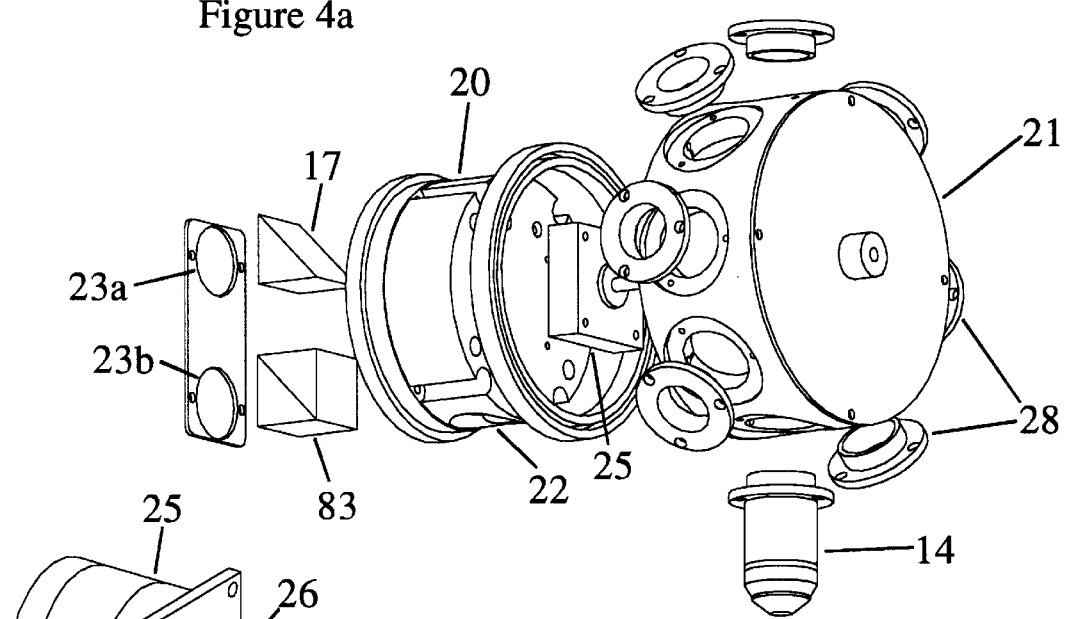
FIGS. 4a and 4b show exploded views of two embodiments of the objective lens turret.

An exploded view of the objective lens turret is seen in FIG. 4a. Turret 13 is comprised of an internal drum 20 and an external drum 21. The internal drum has an open end and a passage in its side wall 22 for admitting a light beam to the interior of drum 20. [The internal drum may be manufactured in one piece as a hollow drum having one open end and one closed end. A cover plate 23 is mounted over the open end of the hollow drum, and has an opening 23a for allowing the passage of light from prism 17 to tube lens 16.] Prism 17 is mounted inside the internal drum, and rigidly secured to plate 23. Drum 20 is rigidly mounted on one end of channel 5 of the microscope stand, so that the open end of drum 20 communicates with the interior of channel 5. The light passage 22 in the side wall of drum 20 is directly vertically toward the stage. A second opening 23b in plate 23 may be used to admit a beam of light to a beamsplitter 83 positioned in the drum 20. The purpose of the beam-splitter will be discussed later.

The external drum 21 is mounted on the outer surface of the internal drum through a rotary bearing 24, allowing drum 21 to rotate about its cylindrical axis. The outer drum holds the objective lenses 14, which are evenly spaced about the tubular side wall of the external drum. Each objective lens is directed outwardly, at right angles to the axis of rotation of the drum. By rotating the outer drum relative to the inner drum, any of the objective lenses can be positioned over the light passage 22 in the wall of drum 20. When an objective lens is positioned over the light passage, a light beam can pass through the objective lens and enter the interior of drum 20.

Prism or mirror 17 is rigidly positioned inside the internal drum by securing prism or mirror 17 to the interior of the closed end of the internal drum. The prism or mirror can then bend a light beam admitted to the interior of drum 20 through an objective lens, and direct the light beam out of drum 20 through its open end. Generally, the light beam enters drum 20 perpendicularly to the axis of rotation of drum 21 and exits the drum 20 parallel to the axis of rotation through the open end of the cylindrical drum.

Figure 4B:
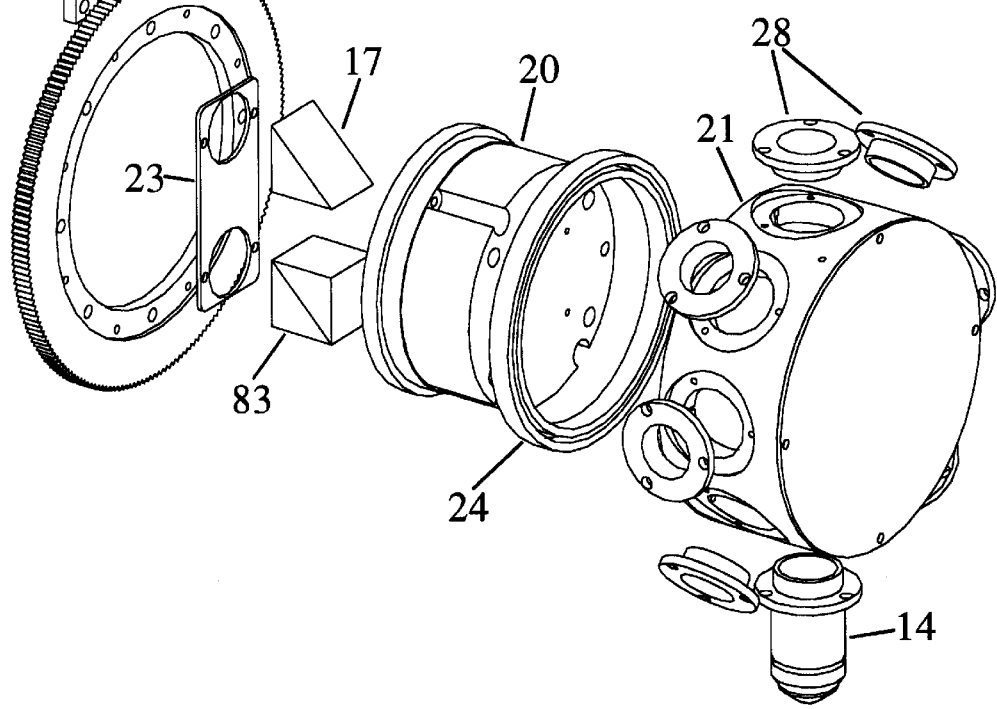

A stepper motor 25 is used to rotate drum 21 relative to drum 20. In one embodiment (FIG. 4a), motor 25 is rigidly mounted to the interior of drum 20, and has a rotatable drive shaft which is colinear with the rotational axis of drum 21. The drive shaft is rigidly connected to an interior surface of drum 21, so that drum 21 rotates when the motor rotates the drive shaft. In another embodiment, shown in FIG. 4b, (note that parts serving identical functions in FIG. 4a and FIG. 4b are identically numbered) motor 25 is rigidly mounted to the exterior of channel 5 (not shown in FIG. 4b), motor 25 is rigidly mounted to the exterior of channel 5 (not shown in FIG. 4b), and has a drive shaft which rotates a first gear 26. This first gear meshes with a second gear 27 which is rigidly secured to the exterior of the external drum. Rotation of the first gear by the motor causes the second gear, and the external drum attached thereto, to rotate.

The objective lenses are typically mounted to the side wall of drum 21 using threaded rings 28 that allow exact positioning of lenses 14. Any type of objective lenses may be used in this system. Such lenses are usually compound lenses having defined magnifications ranging from 2×to 100×. Typically, from three to twenty objective lenses are mounted on the objective lens turret, with no two objective lenses having the same magnification. The least expensive objective lenses contemplated for use in this system are achromat lenses that have chromatic correction for two wavelengths of light and spherical correction for one wavelength of light. Apochromat lenses, which have chromatic correction for three wavelengths of light and spherical correction for two wavelengths of light, are also usable. However, apochromat lenses are much more expensive than achromat lenses, and add greatly to the cost of the unit. A correction to flatten the field to assure all areas of the image are focused onto the same plane may also be incorporated into the objective lens.

When the light beam exits drum 20 through its open end, it enters channel 5. This channel contains a lens system adapted to focus an image carried by the light beam onto the imaging plane of a video camera 15. More particularly, the image is focused onto a CCD chip mounted in a camera body. Channel 5 typically contains a tube lens 16 which is positioned several centimeters from the objective lens seating surface. An additional lens may be required to adjust the size of the image focused by the first optical pathway so that the entire image fits on the surface of the CCD chip. The focus of the image onto the CCD chip may be adjusted by moving channel 5 vertically up or down in hole 4. As the objective lens turret is mounted on channel 5 above the stage, this varies the distance between a sample to be observed and the objective lens.

The focused image is transmitted from the video camera to the screen of a true-color, personal computer monitor. There, the image may be viewed at a worker's leisure without causing back pain or eye strain.

The optical elements mounted in channel 5 may be positioned anywhere along the optical channel. Any standard commercially available components may be used. Appropriate selection of optical components allows the user to configure the imaging path for any mode of operation, including fluorescence, differential interference contrast, brightfield, darkfield, etc. In a preferred embodiment, a side or top cover of channel 5 may be removed to allow the optical components stored therein to be removed and replaced with entirely different optical components. This facilitates the mixing and matching of optical components to achieve a variety of results, greatly enhancing the versatility and utility of the microscope.

D) The Stage

In an upright microscope, the stage is mounted to the horizontal plate 1, and is positioned immediately below rotating turret 13. In an inverted microscope, the stage is mounted above the turret 13. The stage is adapted to support one or more samples, and is able to move the sample in a horizontal plane so as to correctly position the sample in the microscope's field of view. The currently contemplated stages include a 10 cm ×15 cm biological stage adapted to hold up to eight microscope slides and a 20 cm ×20 cm industrial stage. Other stage designs are possible.

Figure 5:
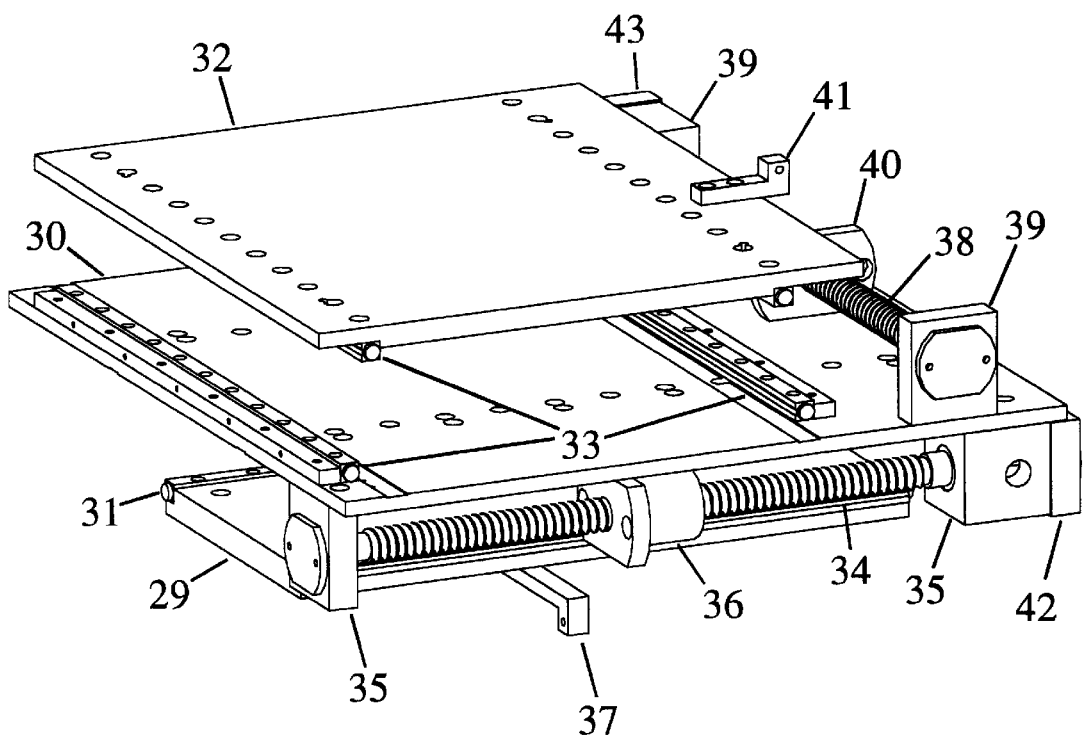
FIG. 5 shows an exploded view of the microscope stage.

The stage is constructed from three plates, and will be described for an upright microscope. An exploded view of the stage is seen in FIG. 5. A first horizontal support plate 29 is rigidly mounted above the horizontal plate 1. A second horizontal plate 30 is then mounted on the first support plate using linear bearings 31. These linear bearings are preferably high-precision crossed roller bearings or linear recirculating ball bearings. The linear bearings allow plate 30 to move horizontally in the y-direction, relative to plate 29. A third horizontal plate 32 is then mounted on plate 30 using linear bearings 33. These bearings allow plate 32 to move horizontally in the x-direction, which is orthogonal to the y-direction. By moving plates 30 and 32 in mutually orthogonal directions, plate 32 may be moved freely to any position in a defined field of from 10 cm ×10 cm up to 90 cm ×90 cm. Plates 29, 30, and 32 should be able to transmit light if illumination by transmitted light is contemplated; if only incident light illumination is to be used, the plates may be opaque.

Figure 6:
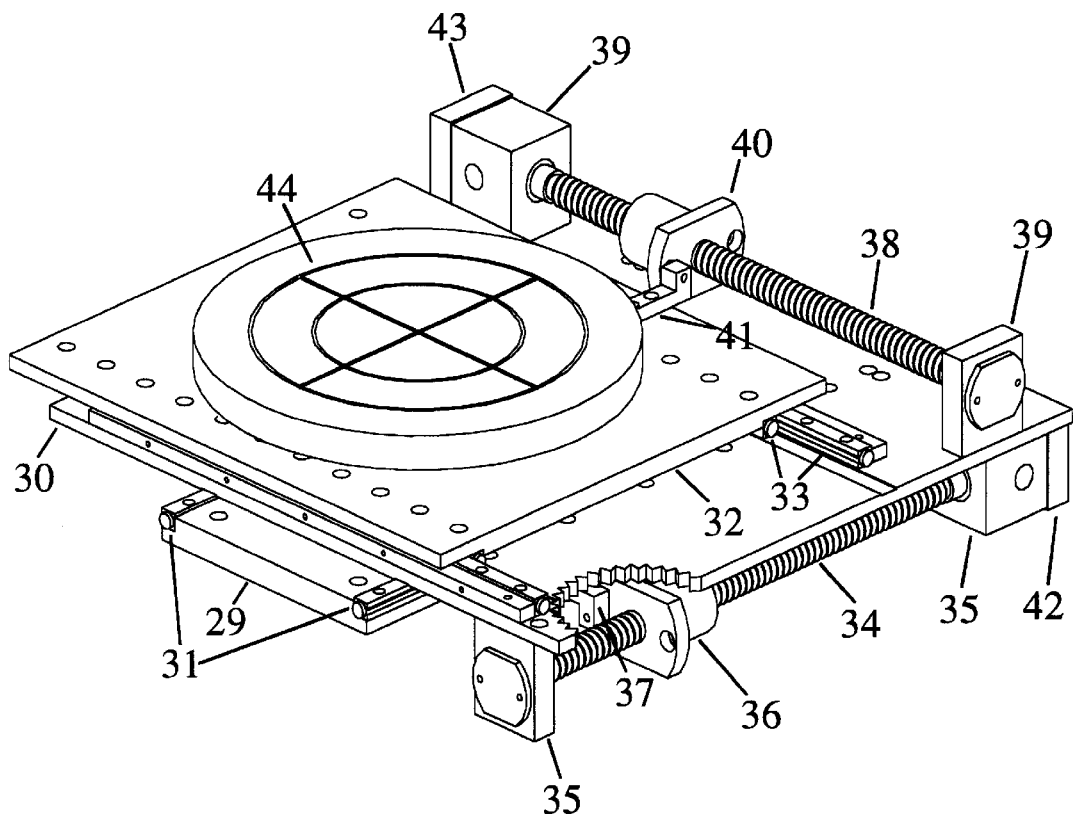
FIGS. 6 and 7 show two embodiments of stages adapted to rotate a sample.

The stage assembly also includes a means for driving plate 30 in the y-direction and a similar means for driving plate 32 in the x-direction. The means for driving plate 30 comprises a horizontal threaded screw 34 rotatably mounted on the plate 29 by means of brackets 35. The axis of screw 34 is parallel to the y-direction. A nut 36 driven by the first screw 34 is rigidly attached to plate 30. Nut and screw must be attached to different plates by means of bracket 37. Rotation of screw 34 causes nut 36 to travel in the y-direction, carrying plates 30. Reversal of the direction of rotation of screw 34 causes nut 36 to reverse its direction of travel. Screw 34 is preferably a ball screw and nut 36 is preferably a recirculating ball nut; however, conventional screws and nuts may be used instead. Plate 32 is driven in a similar fashion. A second screw 38 is rotatably mounted on plate 30 by means of brackets 39, with its axis pointed in the x-direction. A second nut 40 driven by the screw 38 is rigidly attached to plate 32 by means of bracket 41 (Due to the exploded view in FIG. 5, clip 41 is only shown as being attached to plate 32; it is in point of fact also attached to nut 40. FIG. 6 shows the correct attachment of bracket 41 to plate 32 and nut 40.). If desired, a rack-and-pinion system may be used to drive plates 30 and 32, instead of screws.

Screws 34 and 38 are rotated by stepper motors 42 and 43. Preferably, the stepper motors are electronically driven and have a 0.9° step angle. Use of such a motor allows the stage to be positioned with excellent resolution. For example, let us suppose that plate 32 is driven by a ball screw 38 having 2 mm pitch. Such a ball screw will drive plate 32 2 mm/revolution. Driving screw 38 with a stepper motor 43 having a 0.9° step angle (400 steps/revolution) will result in a minimum movement of plate 32 of 5 micrometers. Employing quarter-step drive electronics increase the number of steps/revolution to 1600, reducing the minimum plate movement by a factor of 4. Microstepping drive electronics can increase the steps/revolution by orders of magnitude; however, this significantly increases the system cost.

Figure 7:
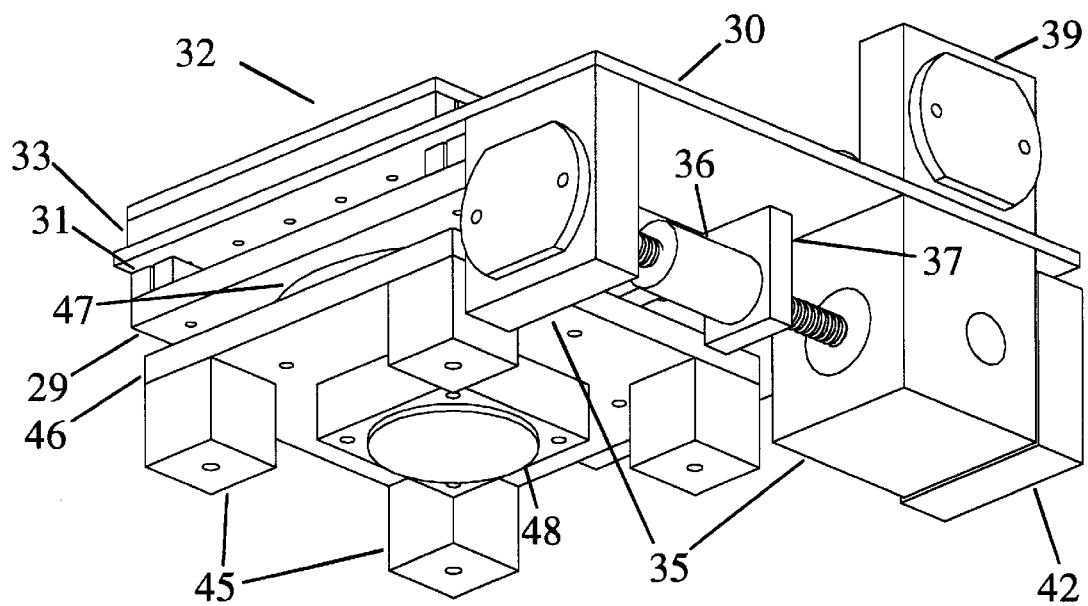

The stage can also be adapted to rotate a sample, if desired. This is useful in studies of semiconductor wafers. For example, a rotating vacuum chuck 44 may be mounted on plate 32 via a rotary bearing (FIG. 6; rotary bearing is not shown). The rotary bearing also provides the required vacuum seal. A stepper motor (not shown) mounted under plate 32 is used to rotate chuck 44. The drive shaft of the motor passes through plate 32, and is rigidly attached to the underside of chuck 44. Alternatively, plate 29 may be mounted on a mounting plate 46 via a rotary bearing 47, rather than being rigidly secured to plate 1 (FIG. 7). The drive shaft of a stepper motor 48 mounted to plate 46 is connected to the underside of plate 29, and may be used to achieve 360° rotation of plate 29.

The stage may be mounted on plate 1 by means of legs 45, shown in FIG. 7.

E) The Illumination System

Figure 8:
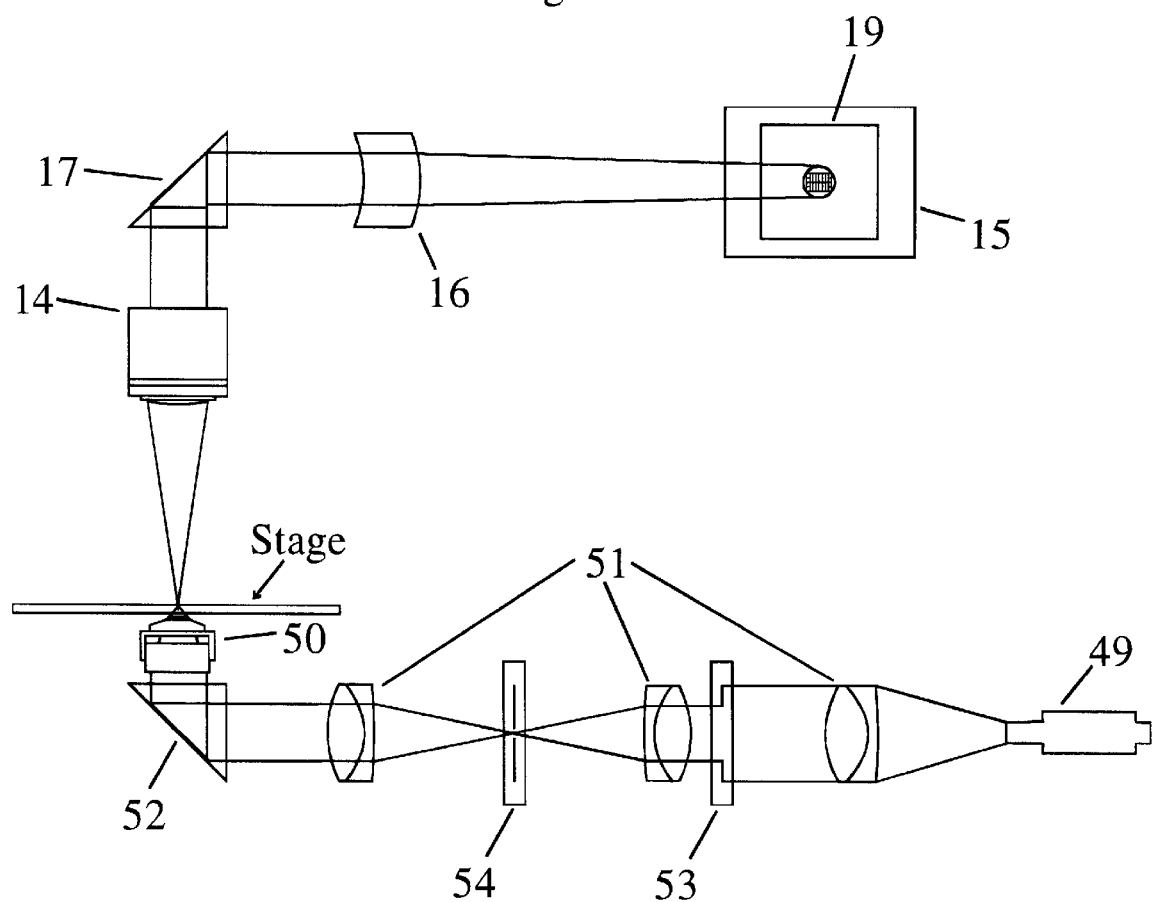
FIG. 8 shows a transmitted light illumination system and its use to direct a light beam through the stage toward the objective lens.

An illumination system adapted to illuminate a sample using transmitted light is illustrated in FIG. 8. The illumination system includes a light source 49, a condenser lens 50, and a lens system adapted to transmit a beam of light from the light source to the condenser lens. The light source is typically a fiber optic light guide, although other types of light sources may be used. Condenser lens 50 is positioned beneath the stage, and is directed upward through the stage toward lens turret objective lens 14. The condenser lens 50 collects and concentrates the beam of light received from the lens system and directs the concentrated beam of light vertically through the stage. The concentrated light beam passes through a sample on the stage and enters the lens turret through the objective lens 14, whereupon the previously described imaging system focuses the light beam onto the imaging plane of video camera 15.

The lens system for the transmitted light illuminating system is positioned horizontally under the stage, in channel 6. The elements of the lens system typically include:

a) a plurality of lenses 51 adapted to direct a beam of light from the light source horizontally through channel 6;

b) a right-angle prism or mirror 52 adapted to bend the light beam upwards at a right angle toward condenser lens 50;

c) an aperture diaphragm 53 positioned near the entrance to channel 5 adapted to control the numerical aperture of the light which is allowed to enter channel 5; and d) a field diaphragm 54 positioned between diaphragm 28 and prism or mirror 27 adapted to ensure that the microscope's entire field of view is illuminated. Lenses 51 focus the beam of light from the light source through the field diaphragm 54, and then collimate the beam of light and direct it onto prism 52, which bends the light beam towards condenser 50. Diaphragm 53 controls the angle theta made by the beam of light with the axis of the channel as it passes through diaphragm 54.

For transmitted light systems, Koehler illumination is achieved by optimizing condenser lens focus, aperture diaphragm opening, and field diaphragm opening. This is done using the following procedure:

a) Focus the image and then position the substage condenser lens 50 at a point where the edge of the aperture in the field diaphragm 54 is in focus.

b) Open the aperture in the aperture diaphragm 53 to from ⅔ to ⅘ of the opening of the condenser lens 50.

c) Set the field diaphragm opening so that the on-screen shadow of the field diaphragm 54 is just beyond the microscope's field-of-view.

This procedure must be followed each time a new objective lens is used with the microscope, as the correct settings are different for each objective lens. In particular, it is important to change the size of the opening in the aperture diaphragm each time the objective lens is changed so that the numerical aperture of the diaphragm matches that of the objective lens.

Figure 9A:
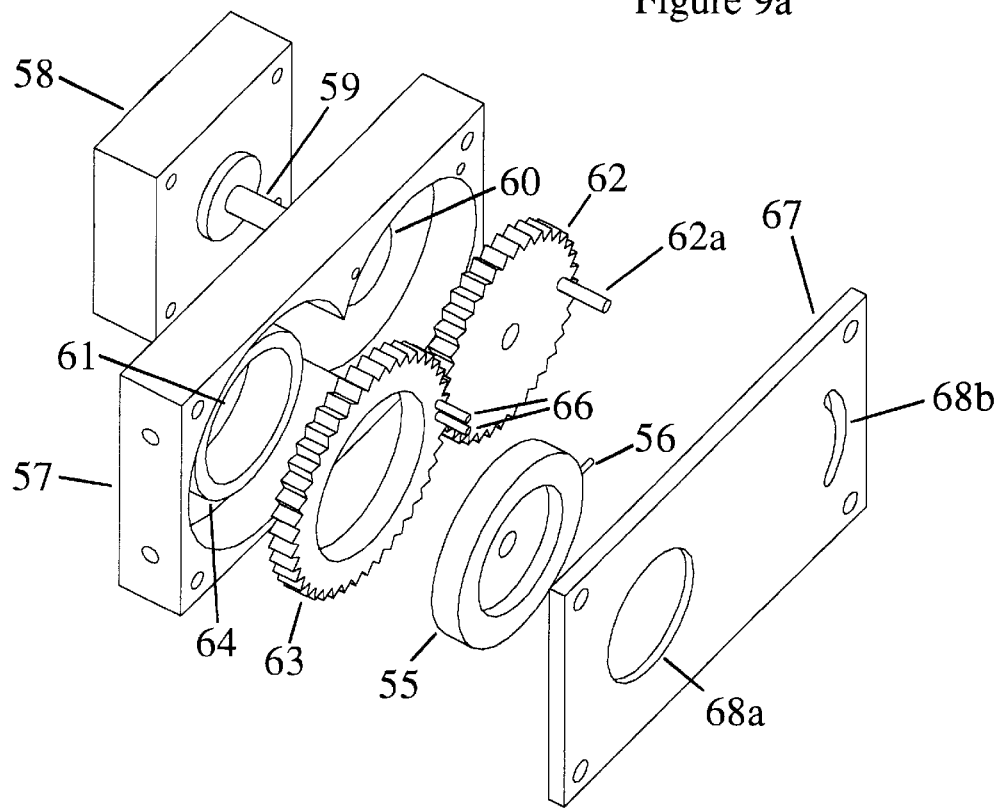
FIGS. 9a, 9b, and 9c show exploded views of a diaphragm, a lens, and a polarizing filter for use in this microscope, respectively.

The construction of the diaphragm is shown in FIG. 9a. A precision iris diaphragm 55 having a metal casing and an edge-mounted lever 56 which controls the size of the aperture is used as the diaphragm. Such a diaphragm is available from Edmund Scientific (Stock No. A35,110, for example). A base plate 57 having a stepper motor 58 mounted to one side thereof is provided. The drive shaft 59 of the stepper motor passes through a first hole 60 in the base plate. The side of the base plate opposite that to which the stepper motor is mounted has a depression 61 therein adapted to receive two intermeshed gears, including a drive gear 62 which is rotated by the stepper motor and a ring-shaped gear 63 which is rotated by the drive gear. The base plate additionally has a ring-shaped ridge 64 surrounding a second hole 65 in the base plate. The casing of the iris diaphragm 55 is fixedly mounted to ridge 64, with the edge-mounted lever 56 being trapped between two pins 66 on the ring-shaped gear. Rotation of gears 62 and 63 by the stepper motor causes pins 66 on the ring-shaped gear to move the edge-mounted lever 56, changing the aperture of the diaphragm. The stepper motor rotates the gears under computer control. A cover plate 67 having a hole 68a allowing light to travel through the diaphragm is mounted over the depression in the base plate. A pin 62a on gear 62 passes through a curved slot 68b in plate 67. Rotation of gear 62, causes pin 62a to travel along slot 68b. When the pin reaches the end of slot 68b the gears stop rotating. This prevents the diaphragm from opening too far.

Figure 9B:
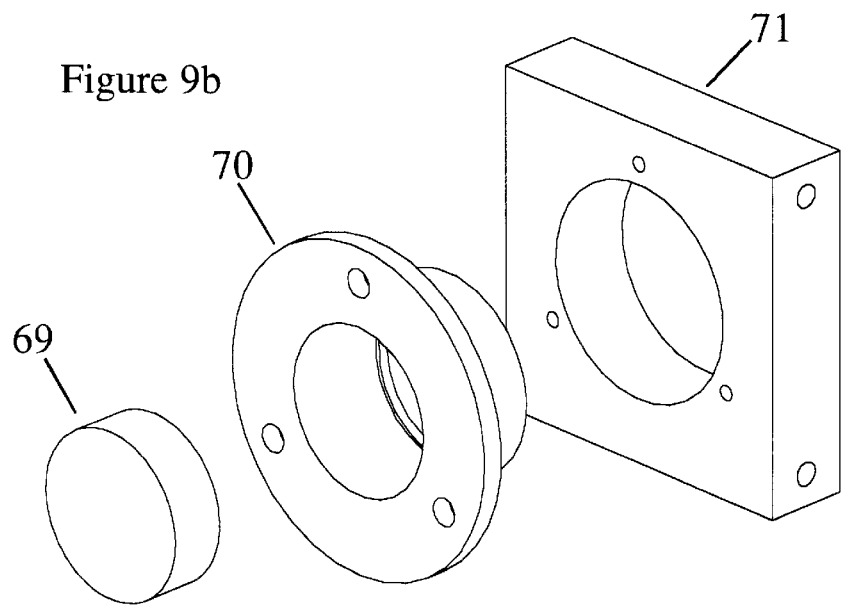

The lenses are constructed as shown in FIG. 9b. A lens 69 is positioned in a ring-shaped lens holder 70. Lens holder 70 is then fitted into a hole passing entirely through a lens block 71.

Figure 10:
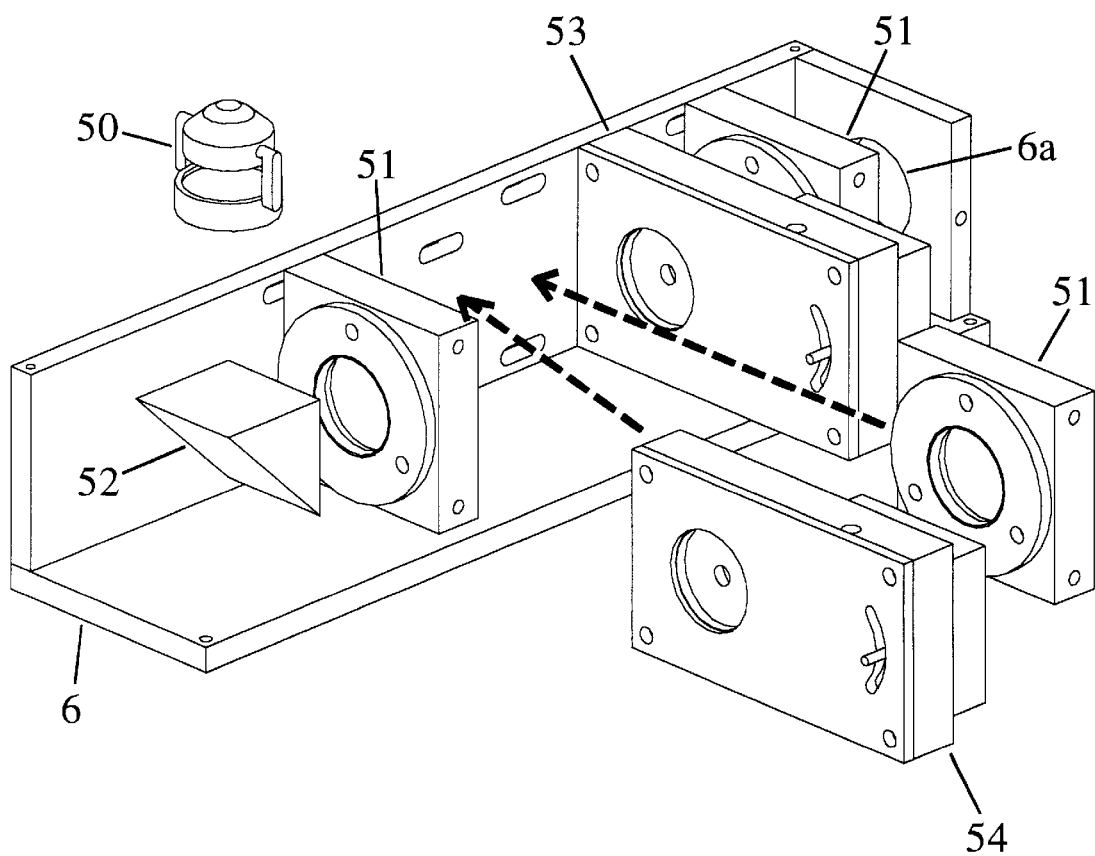
FIG. 10 illustrates how optical elements such as lenses and diaphragms are positioned in an optical channel.

As shown in FIG. 10, channel 6 is designed to allow for rapid insertion of elements 51, 53, and 54 into the optical path through the opening in the side of channel 6. The diaphragm cases and the lens blocks are designed to fit securely into channel 6 so that the lenses and the diaphragms are correctly positioned in the path of the beam of light from the light source, which enters channel 6 through port 6a. Elements 51, 53, and 54 may be withdrawn from channel 6 with equal simplicity, allowing for their removal from the optical path and replacement with other elements that may be better suited for a particular purpose.

Figure 9C:
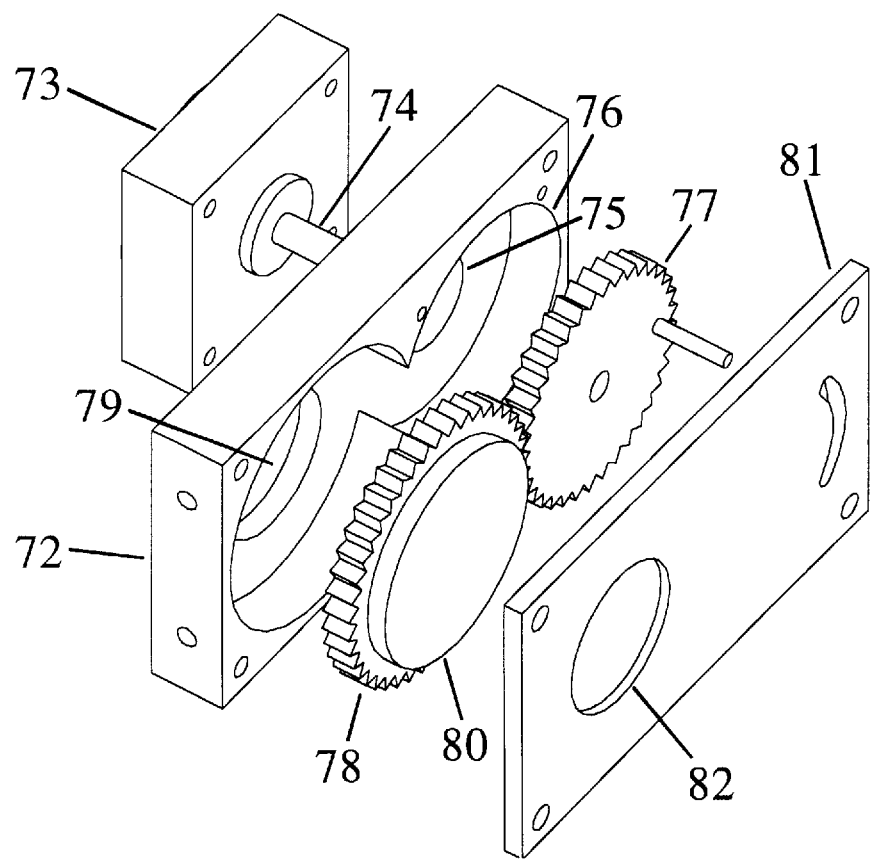

Alternatively, additional elements, including filters and/or polarizers may be inserted into channel 6, allowing the microscope to be used for fluorescence microscopy or polarized light microscopy. For example, fluorescence microscopy may be done be insertion of an appropriate filter into the illumination path (channel 6), as well as insertion of a filter into the imaging path (channel 5). A stationary filter may be prepared from the lens assembly of FIG. 9b by simply replacing lens 69 with a piece of filter material. A simple rotating polarizer which is designed for use with this microscope, illustrated in FIG. 9c, allows the microscopist to perform polarized light microscopy. This polarizer is made using a base plate 72 having a stepper motor 73 mounted to one side thereof. The drive shaft 74 of the stepper motor passes through a first hole 75 in the base plate. The side of the base plate opposite that to which the stepper motor is mounted has a depression 76 therein adapted to receive two intermeshed gears, including a drive gear 77 which is rotated by the stepper motor and a ring-shaped gear 78 which is rotated by the drive gear. The base plate has a second hole 79 in the base plate which allows light to pass through the ring-shaped gear. A polarizing filter 80 is rigidly mounted inside the ring-shaped gear. Computer-controlled rotation of the gears by the stepper motor rotates the polarizing filter. A cover plate 81 having a hole 82 allowing light to travel through the polarizing filter is mounted over the depression in the base plate. By rotating the polarizing filter in this manner, it is easy to do polarized light microscopy without requiring a rotating stage. If desired, the polarizer may be inserted into the imaging path as well as, or instead of, into the illumination path.

Figure 11:
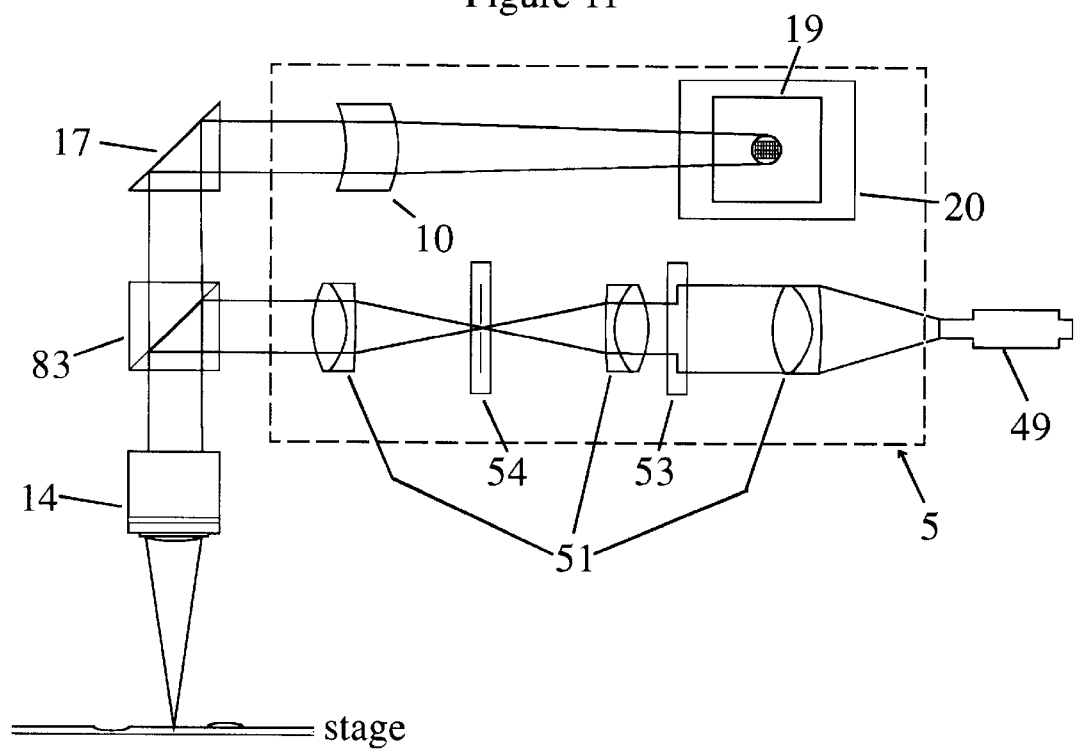
FIG. 11 shows an incident light illumination system and its use.

The sample may also be illuminated by an incident light system, illustrated in FIG. 11. Such a system comprises a lens system for directing a beam of incident light from a light source 49 through the open end of the cylindrical drum of the objective lens turret, and a beamsplitter 83 rigidly mounted in the cylindrical drum (For reasons of clarity, the cylindrical drum is not shown in FIG. 11). The beamsplitter is mounted in lens turret 13 between the objective lens 14 in current use and the rightangle prism 17. Beamsplitter 83 reflects the beam of incident light entering the cylindrical drum through the objective lens and onto the sample, and transmits a light beam reflected vertically off of the sample to right-angle prism 17.

As shown in FIG. 11, the lens system in the incident light illumination system is mounted in channel 5, immediately beneath the imaging optics. The optical elements in the lens system for the incident light illumination lens system are essentially identical to those of the transmitted light illumination lens system, as can be seen by a comparison of FIGS. 8 and 11. Channel 5 is designed to allow for rapid and convenient exchange of optical elements, in much the same way as channel 6.

Both an illuminating system using transmitted light and an illuminating system using incident light may be provided in the same microscope, although only one should be used at a time. If both are provided, they should each have their own light source, and a mechanism for selectively activating either the light source for the illuminating system using transmitted light or the light source for the illuminating system using incident light should be provided.

F) Computer Control

The microscope of this invention is adapted to be placed under computer control. All key operations, including magnification, image focusing and sample positioning, are remotely accomplished from the computer. This relieves the operator from stress-induced fatigue resulting from maintaining the rigid posture required to operate other microscopes.

The degree of magnification to which an image is subjected is controlled by the computer. The operator enters a desired magnification. After the computer receives this input, it selects an objective lens having the desired magnification from among the objective lenses mounted on the objective lens turret 13. The computer then sends a signal to stepper motor 25. This signal causes motor 25 to rotate drum 21 until the selected objective lens is positioned vertically above the stage (below the stage in an inverted microscope). This places the selected objective lens in the path of a light beam coming from the direction of the sample.

Focus adjustment is achieved by moving channel 5 vertically up or down in hole 4 using the screw rotatably mounted to plate 2, as previously described. This adjusts the focus of the observed image by varying the distance between the stage and the objective lens. Rotation of the screw is performed by a stepper motor, preferably a 0.45° step angle stepper motor, which is under the control of a computer. If an observed image is out of focus, the operator directs the computer to move the objective lens vertically toward or away from the stage. The computer then sends a signal to the stepper motor causing the stepper motor to rotate the screw. Depending on the direction of rotation, channel 5 is then moved vertically up or down. Once the image is in focus, the operator instructs the computer to stop the movement of channel 5. The position of the optical channel 5 at this time may be stored in memory. The stored channel position can be recalled at a later time, and the computer can automatically return the channel 5 to this position.

Stage position may also be placed under computer control. The stepper motors rotating screws 34 and 38 are adapted to receive instructions from a computer. An operator enters a distance which he desires the stage to travel in the x-direction. The computer responds by rotating screw 38 until plate 32 has traveled for the desired distance. Similarly, if the operator requests that the stage travel a desired distance in the y-direction, the computer rotates screw 34 until plate 30 has traveled for the desired distance. Alternatively, the operator may use x,y coordinates to specify a position that he wishes to have placed at the center of the field-of-view. The computer will cause the stepper motors to rotate screws 34 and 38 until this site is correctly positioned. If the stage is adapted to rotate, the stepper motor rotating the stage may be placed under computer control. If an operator instructs the computer that he wishes to rotate the viewed image a defined number of degrees about the z-axis, the computer will instruct the stepper motor rotating the stage to rotate the stage by the desired amount.

The computer is also adapted to store, for each objective lens individually, the correct settings for diaphragms 53 and 54 in the illumination system. Each time an objective lens is changed, the computer can recall the stored settings for the diaphragms and automatically reset them. If necessary, the operator can instruct the computer to change the diaphragm settings at will.

Finally, the computer can store the image focused onto the imaging plane of the video camera in a memory. This stored image can then be recalled at a later time and sent to a video monitor.

G) Optional Accessories

As shown in FIG. 12, a cartridge slide holder is available for use with this microscope. A movable cartridge 84 supports one or more horizontal slides by their edges using shelves 85 (FIG. 12*a*). If multiple slides are used, they are supported in such a way that they are vertically separated from each other by a distance at least equal to the thickness of stage plate 32. The cartridge is mounted on a vertical screw 86 by a nut 87 which is driven by screw 86 (FIG. 12*b*). Screw 86 is held in position by means of brackets 88 which are secured to a cartridge cover 89 (For reasons of clarity, the cartridge cover has been partially removed from FIG. 12*b*). Screw 86 is rotated by a computer-controlled stepper motor 90. Rotation of screw 86 causes the cartridge to travel vertically on linear bearings 91. The stepper motor controlling screw 86 is operated in synchronization with the x- and y-axis movement of stage top plate 32.

Figure 13:
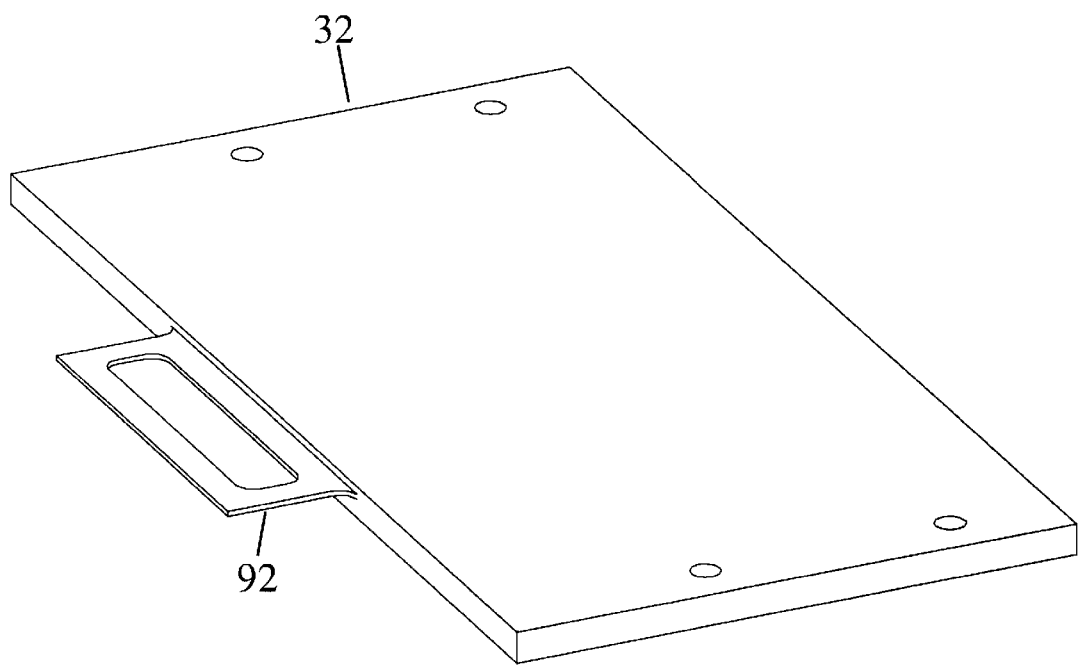
FIG. 13 shows a stage top plate for use with the slide cartridge.

An operator chooses a slide to be viewed from among those positioned in the cartridge. The computer directs the stepper motor to rotate screw 86 until the cartridge positions the desired slide at or slightly above the top of plate 32. The computer then moves top plate 32 horizontally to rest immediately beneath the slide of interest. The cartridge is then lowered to place the slide of interest on plate 32. In a preferred embodiment, plate 32 is modified to include a slide support tab 92, which is specifically adapted to slide under a slide held in cartridge 84 (FIG. 13).

E) Industrial Applicability

This computerized video microscopy system shows obvious is of obvious utility in biology, cytology, materials science, and semiconductor technology. It allows a wide range of tasks to be performed and greatly reduces job-related stress or injury suffered by microscopists.

What is claimed is:

1. A video microscopy system, comprising:
   a) a means for supporting a sample;
   b) a means for producing a vertical beam of light carrying an image of the sample; and
   c) an optical system comprising:
      1) a rotatable objective lens turret, comprising:
         i) a cylindrical drum having a tubular side wall, a open end, a closed end, and a horizontal axis of rotation, said tubular side wall being positioned in the path of the vertical light beam;
         ii) a plurality of light-transmitting objective lenses which are spaced about the tubular side wall of the cylindrical drum, each individual objective lens in said plurality of objective lenses being directed perpendicularly to the axis of rotation of the cylindrical drum;
         iii) a means for selecting an objective lens from among the plurality of objective lenses and rotating the cylindrical drum about its axis of rotation until said selected objective lens enters the path of the vertical light beam; and
         iv) a means rigidly mounted inside the cylindrical drum for directing the vertical light beam out of the cylindrical drum through the open end; and
      2) a lens system adapted to focus an image carried by the light beam exiting the cylindrical drum onto the imaging plane of a video camera.

2. The system of claim 1, wherein the vertical light beam enters the cylindrical drum vertically through the selected objective lens and exits the cylindrical drum horizontally through exchanged with a second lens and said first diaphragm may be exchanged with a second diaphragm.

3. The system of claim 2, wherein the light-directing means inside the cylindrical drum is a right-angle prism, said right-angle prism being adapted to bend the vertical light beam toward the open end of the cylindrical drum.

4. The system of claim 3, wherein the means for producing a vertical light beam comprises:
   a light source;
   a means for directing a beam of incident light from the light source through the open end of the cylindrical drum; and
   a beamsplitter rigidly mounted in the cylindrical drum between the selected objective lens and the right-angle prism;
   wherein the beamsplitter is adapted to reflect the beam of incident light through the selected objective lens and onto the sample and transmit the vertical light beam to the right-angle prism.

5. The system of claim 4, wherein:
   said means for directing a beam of incident light comprises at least one first lens and at least one first diaphragm, wherein said first lens may be exchanged with a second lens and said first diaphragm may be exchanged with a second diaphragm.

6. The system of claim 4, wherein the means for producing a vertical light beam comprises:
   a light source;
   a means for directing a beam of incident light from the light source through the open end of the cylindrical drum;
   a beamsplitter rigidly mounted in the cylindrical drum between the selected objective lens and the right-angle prism; and
   a filter mounted between the light-directing means and the beamsplitter;
   wherein the beamsplitter is adapted to reflect the beam of incident light through the selected objective lens and onto the sample and transmit the vertical light beam to the right-angle prism.

7. The system of claim 6, wherein the filter is a polarizing filter.

8. The system of claim 7, wherein the polarizing filter is adapted to rotate under computer control.

9. The system of claim 3, wherein the means for producing a vertical light beam comprises:
   a) a first illumination system comprising:
      a first light source;
      a means for directing a beam of incident light from the first light source through the open end of the cylindrical drum; and
      a beamsplitter rigidly mounted in the cylindrical drum between the first objective lens and the right-angle prism;
      wherein the beamsplitter is adapted to reflect the beam of incident light through the selected objective lens and onto the sample and transmit the vertical light beam to the right-angle prism;
   b) a second illumination system, comprising:
      a second light source;
      a means for transmitting a beam of light from the second light source to a condenser lens, said condenser lens being adapted to concentrate the beam of light transmitted from the second light source and direct the concentrated beam of light vertically through the stage, being light-transmitting; and
   c) a means for selectively activating either the first light source or the second light source.

10. The system of claim 2, wherein the light-directing means inside the cylindrical drum is a mirror, said mirror being adapted to reflect the vertical light beam toward the open end of the cylindrical drum.

11. The system of claim 10, wherein the means for producing a vertical light beam comprises:
    a light source;
    a means for directing a beam of incident light from the light source through the open end of the cylindrical drum; and
    a beamsplitter rigidly mounted in the cylindrical drum between the first objective lens and the mirror;
    wherein the beamsplitter is adapted to reflect the beam of incident light through the selected objective lens and onto the sample and transmit the vertical light beam to the mirror.

12. The system of claim 1, further comprising:
    d) a memory means adapted to record the image focused onto the imaging plane of the video camera and store the recorded image; and
    e) a means for transmitting the recorded image to a video monitor.

13. The system of claim 1, wherein each objective lenses has a distinct magnification.

14. The system of claim 13, wherein the means for selecting an objective lens and rotating the cylindrical drum is under the control of a computer which is adapted to:
    receive input giving a desired magnification from an operator;
    select an objective lens having the desired magnification from among the plurality of objective lenses; and
    send a signal causing the cylindrical drum to rotate until the selected objective lens is positioned in the path of the vertical light beam.

15. The system of claim 1, wherein the means for selecting an objective lens and rotating the cylindrical drum is under computer control.

16. The system of claim 1, further comprising a means for adjusting the focus of the image on the imaging plane of the video camera.

17. The system of claim 16, wherein the focus-adjustment means comprises a means for altering the distance traveled by the vertical light beam to reach the selected objective lens.

18. The system of claim 17, wherein the focus-adjustment means comprises a rack-and-pinion system, comprising:
    a vertical rack mounted on a horizontal support plate;
    a rotatable pinion engaging the rack, said pinion being attached to the objective lens turret; and a computer-controlled means for rotating said pinion.

19. The system of claim 16, wherein the focus-adjustment means comprises:
    a threaded vertical screw rotatably mounted on a rigid vertical support plate;
    a nut driven by the threaded vertical screw, said nut being attached to the objective lens turret; and
    a means for rotating the vertical screw;
    wherein rotation of said vertical screw causes said nut and the objective lens turret attached thereto to move vertically.

20. The system of claim 19, wherein the means for rotating the vertical screw is under computer control.

21. The system of claim 1, wherein the means for supporting a sample is a stage adapted to move the sample in a horizontal plane.

22. The system of claim 21, wherein the stage comprises:
    a) a first horizontal support plate;
    b) a second horizontal plate mounted on the first support plate, said second plate being adapted to reversibly move horizontally in a first direction; and
    c) a third horizontal plate mounted on the second plate, said third plate being adapted to reversibly move horizontally in a second direction which is orthogonal to the first direction.

23. The system of claim 22, wherein the stage additionally comprises:
    d) a means for driving said second plate horizontally in the first direction; and
    e) a means for driving said third plate horizontally in the second direction.

24. The system of claim 23, wherein the means for driving said second plate and the means for driving said third plate are under computer control.

25. The system of claim 22, wherein the stage additionally comprises:
  d) a means for driving said second plate horizontally in the first direction, comprising:
    a horizontal first threaded screw rotatably mounted on the first support plate, wherein the first screw is parallel to the first direction;
    a first nut driven by the first screw, said first nut being rigidly attached to the second plate; and
    a means for rotating the first screw; and
  e) a means for driving said third plate horizontally in the second direction, comprising:
    a horizontal second threaded screw rotatably mounted on the second plate, wherein the second screw is parallel to the second direction;
    a second nut driven by the second screw, said second nut being rigidly attached to the third plate; and
    a means for rotating the second screw.

26. The system of claim 25, wherein the means for rotating the first screw and the means for rotating the second screw are independently controlled by a computer.

27. The system of claim 21, wherein the stage is light-transmitting.

28. The system of claim 27, wherein the means for producing a vertical beam of light comprises a second lens system adapted to transmit a beam of light from a light source to a condenser lens, said condenser lens being adapted to concentrate the beam of light transmitted from the light source and direct the concentrated beam of light vertically through the stage.

29. The system of claim 28, wherein:
  said second lens system comprises at least one first lens and at least one first diaphragm, wherein said first lens may be exchanged with a second lens and said first diaphragm may be exchanged with a second diaphragm.

30. The system of claim 21, wherein the stage comprises:
  a) a first horizontal support plate;
  b) a second horizontal plate mounted on the first support plate, said second plate being adapted to reversibly move horizontally in a first direction;
  c) a third horizontal plate mounted on the second plate, said third plate being adapted to reversibly move horizontally in a second direction orthogonal to said first direction; and
  d) a fourth horizontal plate mounted on the third plate, said fourth plate being adapted to reversibly rotate about a vertical axis.

31. The system of claim 30, further comprising:
  e) a means for driving said second plate horizontally in the first direction;
  f) a means for driving said third plate horizontally in the second direction; and
  g) a means for rotating said fourth plate about said vertical axis.

32. The system of claim 31, wherein the means for driving said second plate, the means for driving said third plate, and the means for rotating the fourth plate are independently controlled by a computer.

33. The system of claim 21, wherein the stage comprises:
  a) a first horizontal support plate;
  b) a second horizontal plate mounted on the first support plate, said second plate being adapted to reversibly move horizontally in a first direction;
  c) a third horizontal plate mounted on the second plate, said third plate being adapted to reversibly move horizontally in a second direction orthogonal to said first direction; and
  d) a means for rotating the first support plate about a vertical axis.

34. The system of claim 33, further comprising:
  e) a means for driving said second plate horizontally in the first direction;
  f) a means for driving said third plate horizontally in the second direction; and
  g) a means for rotating said first plate about said vertical axis.

35. The system of claim 34, wherein the means for driving said second plate, the means for driving said third plate, and the means for rotating the first plate are independently controlled by a computer.

36. The system of claim 21, further comprising a computer-controlled means for storing a plurality of sample-bearing slides, selecting one slide from among the plurality of slides, and depositing the selected slide on the stage.

37. The system of claim 36, wherein the slide storage means comprises a cartridge adapted to store a plurality of horizontal microscope slides in a spaced-apart relationship and a means for moving the cartridge vertically until the stage is able to move beneath the selected slide.

38. The system of claim 1, wherein the means for producing a vertical light beam comprises a means for reflecting a beam of incident light off of the sample.

39. The system of claim 1, wherein the means for producing a vertical light beam comprises a first light source, a second light source, and a means for either transmitting a beam of light from the first light source vertically through the sample, or reflecting a beam of light from the second light source off of the sample.

40. The system of claim 1, wherein said lens system comprises at least one first lens, wherein said first lens may be exchanged with a second lens.

* * * * *

UNITED STATES PATENT AND TRADEMARK OFFICE
CERTIFICATE OF CORRECTION

PATENT NO. : 5,818,637
DATED : October 6, 1998
INVENTOR(S) : Rex Hoover et al.

It is certified that error appears in the above-identified patent and that said Letters Patent is hereby corrected as shown below:

In claim 2, lines 4-5, delete "through exchanged with a second lens and said first diaphragm may be exchanged with a second diaphragm" and substitute--- through the open end of the cylindrical drum---.

In claim 9, line 22, insert- said stage- prior to the words "being light-transmitting".

In the drawings, sheet 12, Fig. 11, the reference numeral 20 should be replaced by the reference numeral 15, and the reference numeral 10 should be replaced by the reference numeral 16, as shown on the attached drawing.

Signed and Sealed this

Fourteenth Day of December, 1999

Attest:

Attesting Officer

Q. TODD DICKINSON

Acting Commissioner of Patents and Trademarks

UNITED STATES PATENT AND TRADEMARK OFFICE
CERTIFICATE OF CORRECTION

PATENT NO. : 5,818,637
DATED : Oct. 6, 1998
INVENTOR(S) : Rex Hoover etal.

Page 2 of 2

It is certified that error appears in the above-identified patent and that said Letters Patent is hereby corrected as shown below:

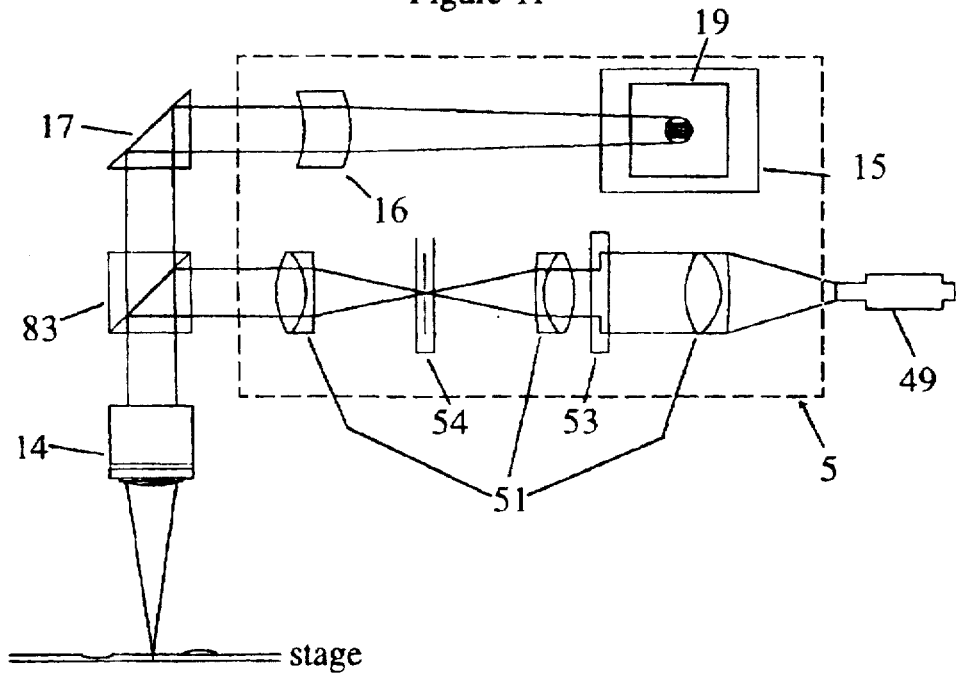

Figure 11